United States Patent
Sanda et al.

(10) Patent No.: US 10,045,453 B1
(45) Date of Patent: Aug. 7, 2018

(54) ELECTRONIC APPARATUS AND ELECTRIC CABLE SEALED THEREIN

(71) Applicant: OMRON Corporation, Kyoto (JP)

(72) Inventors: Takaaki Sanda, Fukuchiyama (JP); Daisuke Inoue, Ayabe (JP); Yusuke Hayashi, Kameoka (JP); Yuki Ushiro, Ayabe (JP); Hiroto Katsura, Ayabe (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/584,025

(22) Filed: May 2, 2017

(51) Int. Cl.
  *H05K 5/06* (2006.01)
  *H05K 5/02* (2006.01)
  *H01B 3/30* (2006.01)

(52) U.S. Cl.
  CPC ............ *H05K 5/069* (2013.01); *H01B 3/308* (2013.01); *H05K 5/0247* (2013.01)

(58) Field of Classification Search
  CPC ....... H05K 5/0247; H05K 5/069; H01B 3/308
  See application file for complete search history.

(56) References Cited

U.S. PATENT DOCUMENTS

| 2011/0187353 A1* | 8/2011 | Mizusaki | H03K 17/9505 324/207.11 |
| 2017/0290180 A1* | 10/2017 | Kume | H05K 5/0247 |

FOREIGN PATENT DOCUMENTS

| EP | 2919567 A1 * | 9/2015 | ......... H03K 17/9505 |
| JP | 2009-043429 | 2/2009 | |
| JP | 2009043429 A * | 2/2009 | |
| JP | 2015-177042 | 10/2015 | |

* cited by examiner

*Primary Examiner* — James Wu
(74) *Attorney, Agent, or Firm* — JCIPRNET

(57) ABSTRACT

To provide an electronic apparatus having particularly excellent environmental resistance. An electronic apparatus includes a case, a cable drawn out from the case, a bonding intermediating member that is made of a resin and joined to the cable, a cylindrical clamp holding the cable, and a sealing resin part filling an internal space defined by the case and the clamp. The cable has a core wire and a sheath that is made of a resin covering the core wire and the core wire is exposed not to be covered by the sheath at an end of the cable. The bonding intermediating member has a cylindrical base covering an outer circumferential face of the sheath and a cylindrical protrusion protruding toward a tip side of the cable. All of an inner circumferential face and an outer circumferential face of the protrusion and an end face at a tip side of the protrusion in an axial direction are covered by the sealing resin part.

9 Claims, 11 Drawing Sheets

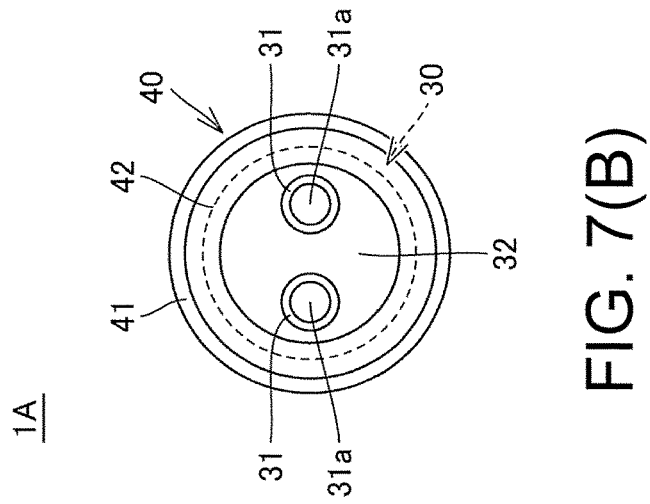
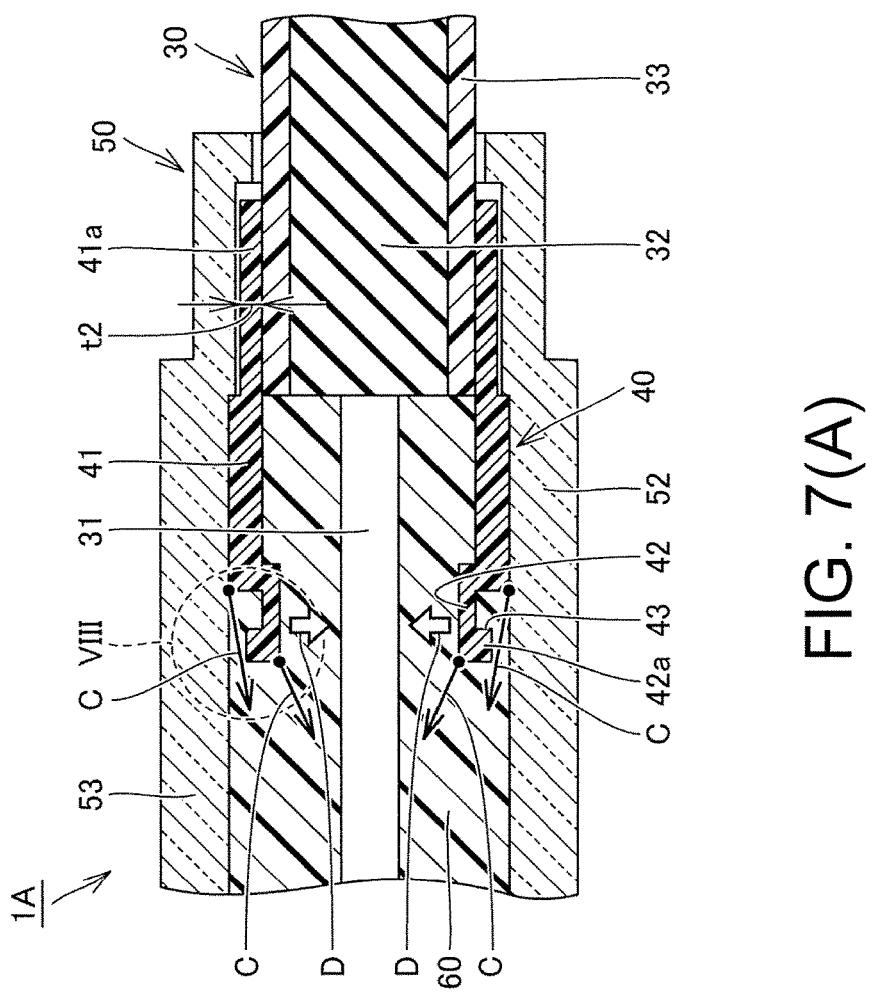
FIG. 7(B)
FIG. 7(A)

ELECTRONIC APPARATUS AND ELECTRIC CABLE SEALED THEREIN

BACKGROUND OF THE INVENTION

Field of the Invention

The present invention relates to an electronic apparatus, and particularly to an electronic apparatus whose internal space of a case is sealed with a resin and in which a cable is drawn out from an inside to outside of the case.

Description of Related Art

In a specific electronic apparatus, an internal space of a case that houses electronic components is sealed with a resin in order to secure environmental resistance. In this case, a problem of how a power supply cable for supplying power, a signal cable for connecting to an external terminal, or the like is drawn out from an inside of the case of the apparatus while securing environmental resistance arises.

In general, a cable such as the above-described power supply cable or signal cable is designed to be held by an elastically deformable clamp that fits into an opening provided in a case to alleviate stress exerted on the cable. In the configuration in which the cable is merely held by the clamp, however, a bonding force between the cable and a sealing resin part which seals an internal space of the case may not be sufficient, and thus separation may occur in a connection section thereof, which worsens environmental resistance consequently.

For that reason, various methods for improving a bonding force between a cable and a sealing resin part have been reviewed, and for example, Japanese Unexamined Patent Application Publication No. 2015-177042 (Patent Document 1) and Japanese Unexamined Patent Application Publication No. 2009-43429 (Patent Document 2) disclose technologies for proximity sensors that detect presence/absence or a position of a metal object using a magnetic field to improve a bonding force between a cable and a sealing resin part provided in the proximity sensor.

In the proximity sensor disclosed in Patent Document 1, a ring cord formed of a polybutylene terephthalate (PBT) resin is formed through insert molding so as to cover an end of a cable formed of a polyvinyl chloride (PVC) resin, a sealing resin part is formed with the ring cord press-fitted into a clamp, and thereby the ring cord ensures a bonding force between the cable and the sealing resin part.

In addition, in the proximity sensor disclosed in Patent Document 2, a two-color molding member formed of a polyurethane (PUR) resin and a PBT resin is formed through insert molding so as to cover an end of a cable, a protrusion having an inverted truncated cone shape is provided at a tip of the two-color molding member, a sealing resin part is formed with the two-color molding member press-fitted into a clamp, and thereby the two-color molding member ensures a bonding force between the cable and the sealing resin part.

PRIOR ART DOCUMENTS

Patent Documents

[Patent Document 1] Japanese Unexamined Patent Application Publication No. 2009-177042
[Patent Document 2] Japanese Unexamined Patent Application Publication No. 2009-43429

SUMMARY OF THE INVENTION

Problem to be Solved by the Invention

However, even when the configurations disclosed in Patent Literature 1 and Patent Literature 2 are adopted, it can be said that sufficient environmental resistance is not secured in relatively harsh environments. For example, in an environment in which a temperature significantly changes as time elapses and a large amount of oil such as cutting oil is used, there is concern of damage such as separation occurring in a connection section of the case and the cable even when the above-described configuration is adopted, which needs to be ameliorated.

Therefore, the present invention has been conceived to solve the above-described problems and aims to provide an electronic apparatus particularly having excellent environmental resistance.

Technical Means Solving the Problem

An electronic apparatus according to the present embodiment includes a case having an opening, an electronic component housed in the case, a cable whose one end is inserted into the opening to be electronically connected to the electronic component and the other end is drawn out to outside, a bonding intermediating member that is made of a resin and joined to the cable, a cylindrical clamp that fits into the opening and holds the cable when the bonding intermediating member fits into the clamp, and a sealing resin part that fills an internal space defined by the case and the clamp. The cable has a core wire including a conductive wire and a resin sheath that is made of a resin covering the core wire, and the core wire is exposed at the one end side of the cable without being covered by the sheath. The bonding intermediating member has a cylindrical base covering an outer circumferential face of the sheath and a cylindrical protrusion protruding toward the one end side of the cable. An inner circumferential face and an outer circumferential face of the protrusion and an end face at a tip side of the protrusion in an axial direction are all covered by the sealing resin part.

As described above, an amount of resin of the sealing resin part at the end of the sealing resin part on the bonding intermediating member side decreases since the cylindrical protrusion is provided in the bonding intermediating member and the inner circumferential face and the outer circumferential face of the protrusion and the end face at the tip side of the protrusion in the axial direction are all covered by the sealing resin part. Thus, residual stress occurring at the time of curing of the sealing resin part is reduced and the protrusion tracks expansion and contraction of the sealing resin part, which are caused by changes of environment temperature, thus is elastically deformed, and thereby stress occurring inside is dramatically alleviated. Accordingly, a strong bonding force between the cable and the sealing resin part can be secured, and thus an electronic apparatus having excellent environmental resistance can be obtained.

In the electronic apparatus according to the present invention, an outer shape of the protrusion is preferably smaller than an outer shape of the base when the protrusion is viewed in an extending direction.

Since the outer shape of the protrusion of the bonding intermediating member is set to be smaller than the outer shape of the base as described above, a configuration of the clamp can be simplified and an outer shape of connection section of the cable with respect to the case can be miniaturized.

In the electronic apparatus according to the present invention, the bonding intermediating member may be fixed to the cable by welding the base onto the sheath.

Since the bonding intermediating member is welded onto the sheath as described above, the bonding intermediating member can be easily fixed to the cable.

In the electronic apparatus according to the present invention, the base may include a welded part that is welded onto the sheath and a non-welded part that is not welded onto the sheath, and in this case, a thickness of the protrusion is preferably thinner than a thickness of the non-welded part.

Since the thickness of the protrusion of the bonding intermediating member is set to be thinner than the thickness of the non-welded part of the base of the bonding intermediating member, a tracking property of the protrusion when the sealing resin part expands and contracts in accordance with changes of environment temperature is further improved, and therefore, a strong bonding force between the cable and the sealing resin part can be secured.

In the electronic apparatus according to the present invention, the bonding intermediating member is fixed to the cable by forming the bonding intermediating member through insert-molding to cover the sheath.

Since the bonding intermediating member is formed through insert-molding as described above, the bonding intermediating member can be easily fixed to the cable.

In the electronic apparatus according to the present invention, the protrusion preferably includes a portion having a thickness in a range of 0.3 mm to 0.5 mm in a circumferential direction of the protrusion.

Since the protrusion of the bonding intermediating member includes the portion having a thickness in a range of 0.3 mm to 0.5 mm as described above, a tracking property of the protrusion when the sealing resin part expands and contracts in accordance with changes of environment temperature is further improved, and therefore, a strong bonding force between the cable and the sealing resin part can be secured.

In the electronic apparatus based on the present invention, a length of the protrusion in an axial direction is preferably greater than or equal to 0.5 mm.

Since the length of the protrusion of the bonding intermediating member in the axial direction is greater than or equal to 0.5 mm, a tracking property of the protrusion when the sealing resin part expands and contracts in accordance with changes of environment temperature is further improved, and therefore, a strong bonding force between the cable and the sealing resin part can be secured.

In the electronic apparatus according to the present invention, a groove extending in a circumferential direction is preferably provided on the outer circumferential face of the protrusion.

Since the groove is provided on the outer circumferential face of the protrusion, the sealing resin part is positioned to fill the groove, the portion serves as an angularity, and thus a strong bonding force between the cable and the sealing resin part can be secured.

In the electronic apparatus according to the present invention, the sealing resin part is preferably formed of one of an epoxy resin and a polyurethane resin, the bonding intermediating member is preferably formed of one of a polybutylene terephthalate resin, a polyurethane resin, a nylon-based resin, and a fluorine-based resin, and the sheath is preferably formed of one of a polyvinyl chloride resin, a polyurethane resin, and a fluorine-based resin.

In the electronic apparatus according to the present invention, the sealing resin part, the bonding intermediating member, and the sheath that are formed of various kinds of resin can be used as described above.

Effects of the Invention

According to the present invention, an electronic apparatus particularly having excellent environmental resistance can be provided.

BRIEF DESCRIPTION OF THE DRAWINGS

FIG. 7(A) to FIG. 7(B) show a schematic cross-sectional view for describing the reason for a strong bonding force that can be secured at a connection section of a cable and a case and a front view of the cable to which the bonding intermediating member is fixed in the proximity sensor of Embodiment 1 of the present invention.

DESCRIPTION OF THE EMBODIMENTS

Figure 1:
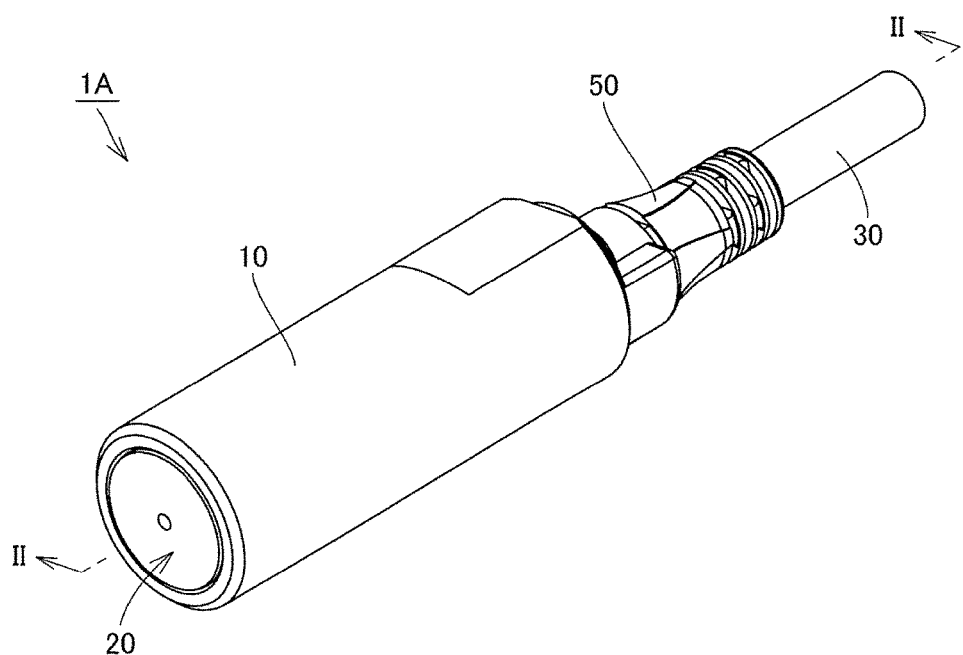
FIG. 1 is a perspective view of a proximity sensor according to Embodiment 1 of the present invention.

Exemplary embodiments of the present invention will be described in detail hereinbelow with reference to the diagrams. Applications of the present invention to proximity sensors will be exemplified in the following embodiments. Note that the same parts or common parts in the following embodiments will be given the same reference numerals in the drawings, and description thereof will not be repeated.

Embodiment 1

Figure 2:
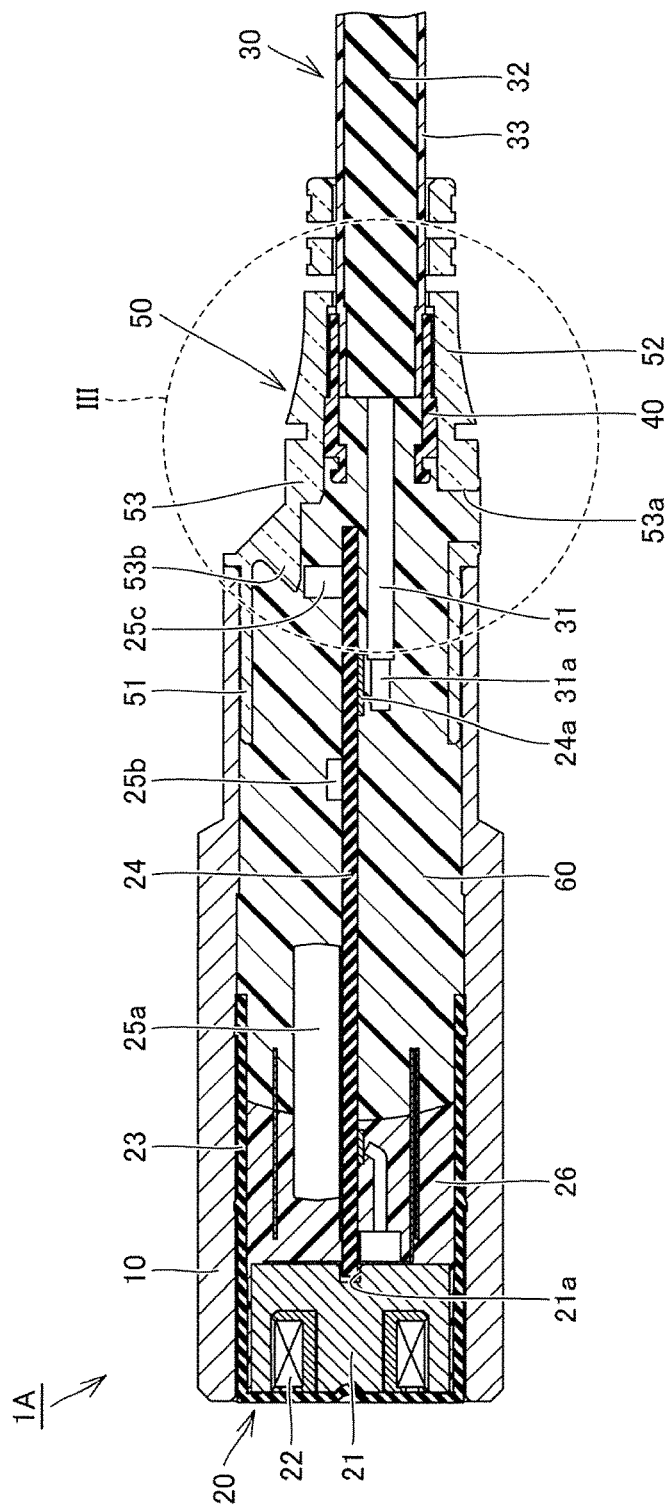
FIG. 2 is a cross-sectional view taken along line II-II shown in FIG. 1.
Figure 3:
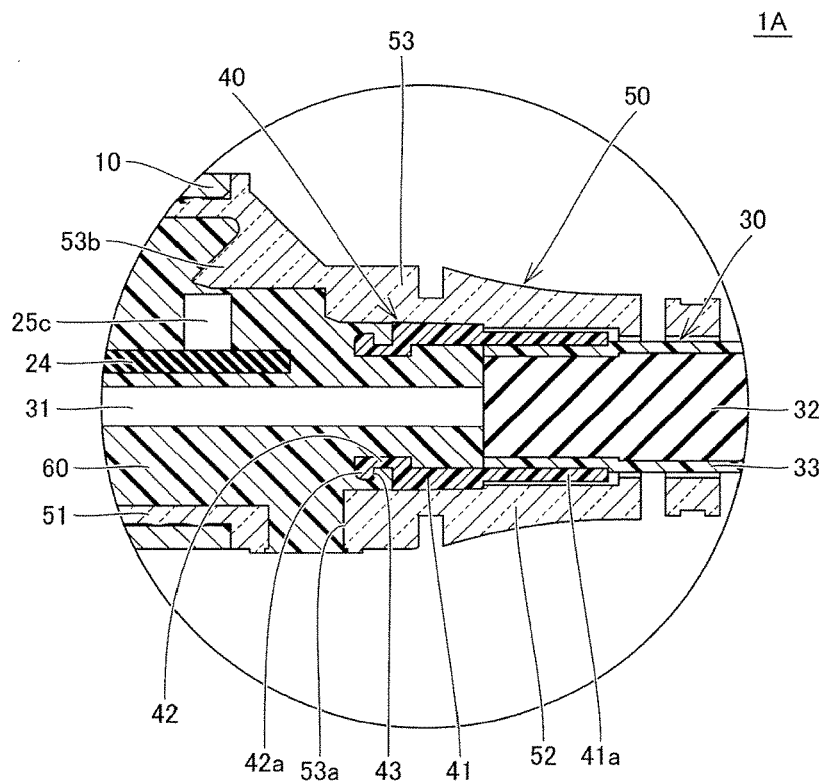
FIG. 3 is an enlarged cross-sectional view of area III shown in FIG. 2.
Figure 4:
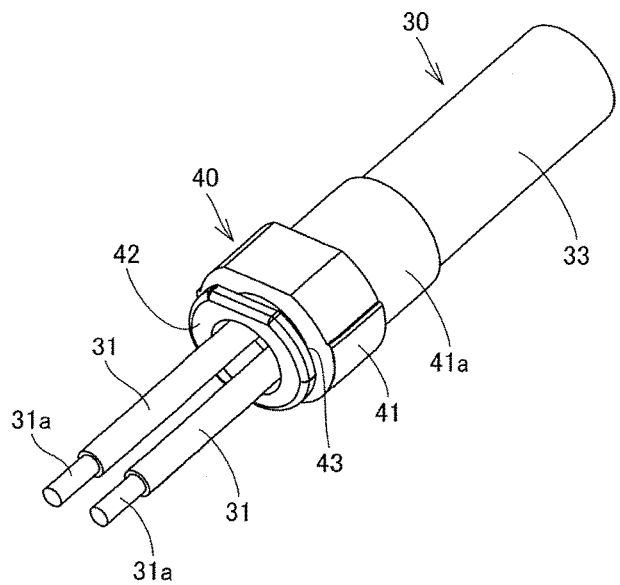
FIG. 4 is a schematic perspective view of a cable shown in FIG. 1 and a bonding intermediating member fixed thereto.

FIG. 1 is a perspective view of a proximity sensor according to Embodiment 1 of the present invention, and FIG. 2 is a cross-sectional view taken along line II-II shown in FIG. 1. In addition, FIG. 3 is an enlarged cross-sectional view of area III shown in FIG. 2, and FIG. 4 is a schematic perspective view of a cable shown in FIG. 1 and a bonding intermediating member fixed thereto. First, a configuration of the proximity sensor 1A of the present embodiment will be described with reference to FIGS. 1 to 4.

The proximity sensor 1A that is an electronic apparatus in the present embodiment has a substantially columnar outer shape and includes a case 10, a detector assembly 20 including a first sealing resin part 26, a cable 30, a bonding intermediating member 40, a clamp 50, and a second sealing resin part 60 as shown in FIGS. 1 and 2.

The case 10 is formed of a long cylindrical metallic member whose both ends are open, having a front end and a rear end in an axial direction. The front end of the case 10 has the detector assembly 20 assembled thereinto, and the rear end of the case 10 has the clamp 50 assembled thereinto.

The detector assembly 20 primarily has a core 21, a detection coil 22, a coil case 23, a circuit board 24, and the first sealing resin part 26 as shown in FIG. 2.

The core 21 is formed of a short columnar member formed of a magnetic material. The detection coil 22 is configured to have substantially cylindrical shapes by winding, for example, a lead wire, and housed in annular recesses provided on a front end face of the core 21. Note that a rear end face of the core 21 has a support groove 21a which supports a tip of the circuit board 24.

The coil case 23 is formed of a bottomed cylindrical insulating member and houses the core 21 and the detection coil 22 therein. The front end face of the core 21 abuts on a bottom of the coil case 23. The coil case 23 is press-fitted into and fixed to the case 10 so that the bottom thereof is positioned at the front end of the case 10.

The circuit board 24 is disposed behind the core 21 to extend in the axial direction of the case 10. The circuit board 24 has a conductive pattern formed on a front and back surface thereof, and various electronic components 25a to 25c are mounted at predetermined positions on the front and back surface. The circuit board 24 is electrically connected to the detection coil 22 via pins placed at ends of the detection coil 22.

Here, the electronic component 25c mounted at a rear end of the circuit board 24 among the various electronic components 25a to 25c mounted on the circuit board 24 is a light emitting element that emits light by an electric current being caused to pass therethrough. The light emitting element emits light in accordance with operation states of the proximity sensor 1A, and is configured with, for example, a light emitting diode (an LED).

The circuit board 24 has a variety of processing circuits formed thereon. The processing circuits include an oscillator circuit which uses the detection coil 22 as resonant circuit elements and a discriminator circuit which compares an oscillation amplitude of the oscillator circuit to a threshold value and generates binary data. The circuit board 24 also includes an output circuit which converts an output of the discriminator circuit into a voltage output or a current output having a predetermined specification and a power source circuit which converts power introduced from outside into power having a predetermined specification and outputs the power. Moreover, the circuit board 24 also includes a light emitting element drive circuit which controls driving of the electronic component 25c that is the above-described light emitting element.

These various circuits are constituted by the conductive pattern provided on the circuit board 24, the above-described various electronic components 25a to 25c and the detection coil 22.

The first sealing resin part 26 seals the core 21 and the detection coil 22 and a front end of the circuit board 24 housed in the coil case 23. The first sealing resin part 26 not only protects the core 21, the detection coil 22, and the front end of the circuit board 24 but also seals them air-tightly and liquid-tightly from outside.

The first sealing resin part 26 is formed by injecting a liquid resin into the coil case 23 and then curing it. Note that, for example, an epoxy resin, a PUR resin, or the like can be preferably used as a material of the first sealing resin part 26.

A land 24a to which a conductive wire 31a, which is included in a core wire 31 of the cable 30 that will be described below, is connected is provided at a predetermined position on the rear end of the circuit board 24. For example, soldering, which is not illustrated, is used to connect the land 24a to the conductive wire 31a.

The cable 30 is configured to be a composite cable constituted by the core wire 31 including the conductive wire 31a, and a shielding material 32 and a sheath 33 covering the core wire 31. The cable 30 is disposed to be inserted into an opening provided at the rear end of the case 10, one end thereof is electrically connected to the above-described various circuits by connecting to the circuit board 24, and the other end thereof is drawn out to outside. Note that the sheath 33 is made of a resin, and more preferably any of a PVC resin, a PUR resin, and a fluorine-based resin.

Here, the shielding material 32 and the sheath 33 are peeled off at the above-described one end of the cable 30 to expose the core wire 31, and a covering material of the core wire 31 is peeled off as well at the part of the core wire 31 that is connected to the land 24a to further expose the conductive wire 31a.

As shown in FIGS. 2 to 4, the bonding intermediating member 40 is a member for securing a bonding force between the cable 30 and the second sealing resin part 60, and is assembled at an end of the sheath 33 positioned at the above-described one end side of the cable 30.

The bonding intermediating member 40 has a cylindrical base 41 that covers an outer circumferential face of the end of the sheath 33 positioned at the above-described one end side of the cable 30 in an internal space defined by the case 10 and the clamp 50 and a cylindrical protrusion 42 that is positioned closer to the one end side of the cable 30 than to the end of the sheath 33 positioned at the one end side of the cable 30 and protrudes to extend in an extending direction of the cable 30. The bonding intermediating member 40 is joined to the cable 30 so that at least a part of the bonding intermediating member 40 goes into the internal space defined by the case 10 and the clamp 50. The protrusion 42 is configured to have a sufficient thickness and to preferably have a thickness thinner than the portion of the base 41 excluding a welded part 41a (i.e., a non-welded part of the base 41), which will be described below. Note that, the bonding intermediating member 40 is made of a resin, and more preferably any of a PBT resin, a PUR resin, a nylon-based resin, and a fluorine-based resin.

Here, in the present embodiment, the base 41 protrudes and extends in a predetermined length from the end of the sheath 33 positioned at the one end side of the cable 30 in the direction away from the one end side of the cable 30, and the above-described protrusion 42 is provided to protrude further from a tip of the portion of the base 41 protruding from the end of the sheath 33.

In addition, an outer shape of the protrusion 42 is configured to be smaller than an outer shape of the base 41 when the protrusion is viewed in an extending direction of the cable 30 in the present embodiment. Due to this configuration, a configuration of the clamp 50, which will be described below, can be simplified, and accordingly, an outer shape of a connection section of the cable 30 with respect to the case 10 can be miniaturized.

The welded part 41a is formed at a rear end of the base 41. The welded part 41a is a portion formed by fixing the bonding intermediating member 40 to the cable 30 using welding and is designed to be thinner than the portion of the base 41 excluding the welded part 41a. As described above, the bonding intermediating member 40 is fixed to the cable 30 so as not to be movable by welding the base 41 onto the sheath 33.

A groove 43 extending in a circumferential direction of the protrusion 42 is provided at a predetermined position on an outer circumferential face thereof. The groove 43 is an uneven part provided to increase a bonding force between the second sealing resin part 60, which will be described below, and the bonding intermediating member 40, and a so-called anchoring effect is gained by providing the groove 43 in the protrusion 42, which enhances the bonding force. Note that the anchoring effect is that a bonding force is enhanced by providing an uneven part that serves as an angularity in a bonding face.

The clamp 50 has a substantially cylindrical shape and the cable 30 is inserted thereinto as shown in FIGS. 2 and 3. The clamp 50 fits into the opening provided at the rear end side of the case 10, and the above-described bonding intermediating member 40 fits into a rear end of the clamp 50, and thereby the cable 30 is held. The clamp 50 is formed of an elastically deformable resin member and alleviates stresses exerted on the cable 30 and the bonding intermediating member 40.

More specifically, the clamp 50 includes a cylindrical fixing part 51 positioned at a front end of the clamp, a substantially cylindrical holding part 52 positioned at a rear end of the clamp, and a connecting part 53 that is positioned between the fixing part 51 and the holding part 52 to connect the fixing part 51 to the holding part 52.

The fixing part 51 is a portion for fixing the clamp 50 to the case 10 when the fixing part is press-fitted into the opening provided at the rear end of the case 10. The holding part 52 is a portion for holding the bonding intermediating member 40 when the bonding intermediating member 40 is press-fitted thereinto. In addition, the connecting part 53 is a portion for improving the function of alleviating stress exerted on the cable 30 and the bonding intermediating member 40 by ensuring a distance between the fixing part 51 and the holding part 52 to be a predetermined distance.

Furthermore, a gate 53a that is used when a liquid resin that forms the second sealing resin part 60 is injected to fill the internal space defined by the case 10 and the clamp 50 with the second sealing resin part 60 is provided at a predetermined position on the connecting part 53.

Note that the clamp 50 is formed of a non-light shielding resin material in the present embodiment. The reason for this is that light emitted from the electronic component 25c serving as the light emitting element is projected to the outside via the clamp 50, and thus a light guiding part 53b having a predetermined shape is provided in a portion of the fixing part 51 facing the light emitting element.

The second sealing resin part 60 fills the internal space defined by the case 10 and the clamp 50 excluding a space sealed by the above-described first sealing resin part 26. Accordingly, the portion of the circuit board 24 excluding the above-described front end thereof, the various electronic components 25a to 25c that are mounted in that portion, and the portion of the core wire 31 that is not covered by the sheath 33 of the cable 30 are sealed by the second sealing resin part 60.

The second sealing resin part 60 protects and air-tightly and liquid-tightly seals the portion of the circuit board 24 excluding the above-described front end thereof, the various electronic components 25a to 25c that are mounted in that portion, and the portion of the core wire 31 that is not covered by the sheath 33 of the cable 30 from outside.

The second sealing resin part 60 is formed by injecting a liquid resin through the gate 53a of the clamp 50 as described above and curing the resin. Note that, for example, an epoxy resin, a PUR resin, or the like can be preferably used as a material of the second sealing resin part 60.

Here, the protrusion 42 of the bonding intermediating member 40 has an inner circumferential face, an outer circumferential face, and an end face at a tip side in an axial direction all of which are covered by the second sealing resin part 60 as shown in FIG. 3. Thus, a stronger bonding force between the cable 30 and the second sealing resin part 60 can be secured in the proximity sensor 1A according to the present embodiment than in a proximity sensor of the related art, and a mechanism thereof will be described below in detail.

Figure 5:
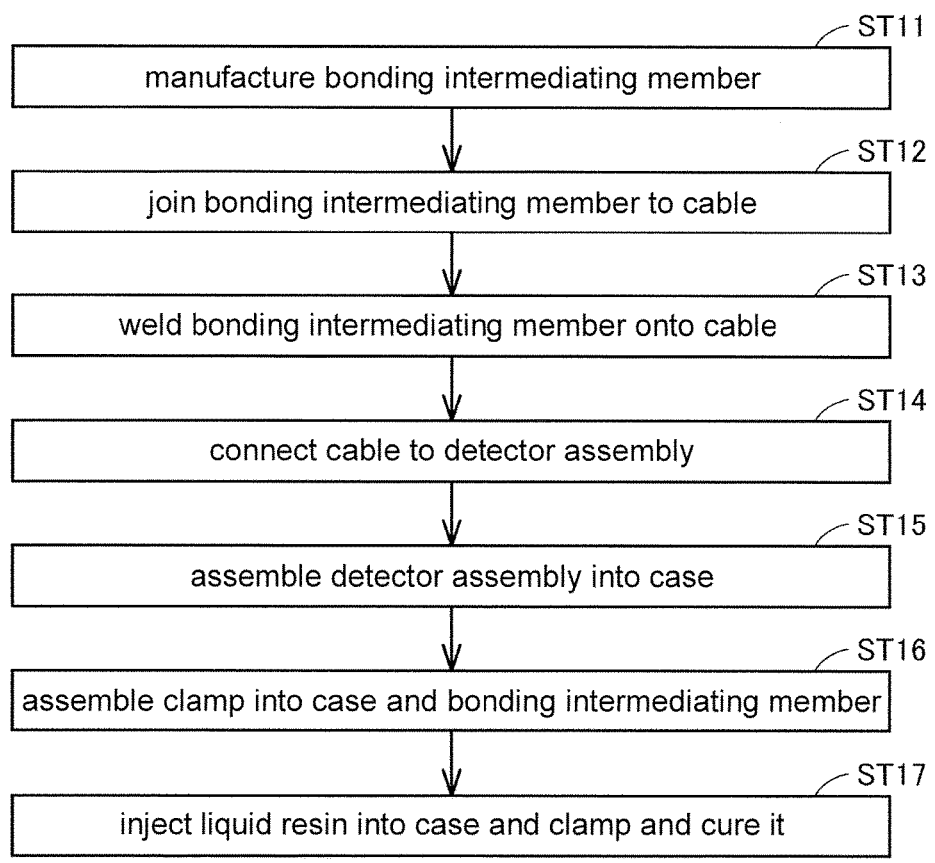
FIG. 5 is a flowchart for describing a manufacturing method of the proximity sensor according to Embodiment 1 of the present invention.

FIGS. 5 and 6 each are a flowchart and an assembly diagram for describing a manufacturing method of the proximity sensor according to the present embodiment. Next, the manufacturing method of the proximity sensor 1A according to the present embodiment will be described with reference to FIGS. 5 and 6.

First, the bonding intermediating member 40 is manufactured as described in FIG. 5 (Step ST11). More specifically, the bonding intermediating member 40 is formed such that the cylindrical base 41 and the cylindrical protrusion 42 extending from the base 41 are provided. Any of various methods, for example, injection molding, or the like can be applied to the manufacturing of the bonding intermediating member 40.

Figure 6A:
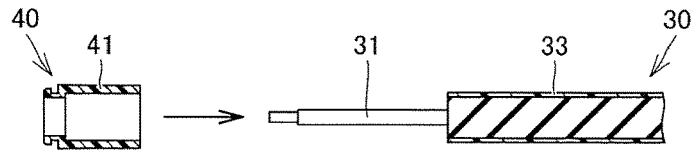
FIG. 6(A) to FIG. 6(E) show an assembly diagram for describing the manufacturing method of the proximity sensor according to Embodiment 1 of the present invention.

Next, the bonding intermediating member 40 is joined to the cable 30 as shown in FIG. 5 and FIG. 6(A) (Step ST12). More specifically, the bonding intermediating member 40 is joined to the cable 30 when the base 41 of the bonding intermediating member 40 is press-fitted to the end of the sheath 33 of the cable 30. Accordingly, the base 41 covers an outer circumferential face of the sheath 33 at the end thereof and the protrusion 42 is positioned to extend from the base 41.

Figure 6B:
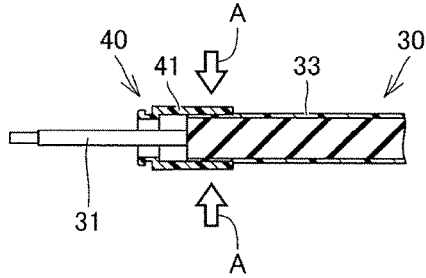

Next, the bonding intermediating member 40 is welded onto the cable 30 as shown in FIG. 5 and FIG. 6(B) (Step ST13). More specifically, the portion of the base 41 which is press-fitted into the sheath 33 (i.e., the portion indicated by arrow A in FIG. 6(B)) is thermally welded by applying heat to the portion from outside. Note that welding using laser radiation or the like as well as thermal welding using heat conduction can be used for the welding.

Figure 6C:
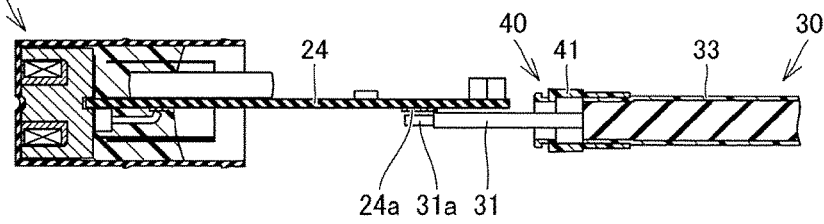

Next, the cable 30 is connected to the detector assembly 20 as shown in FIG. 5 and FIG. 6(C) (Step ST14). More specifically, the conductive wire 31a exposed from the cable 30 is disposed to face the land 24a of the circuit board 24 and then the conductive wire and the land are soldered in that state.

Figure 6D:
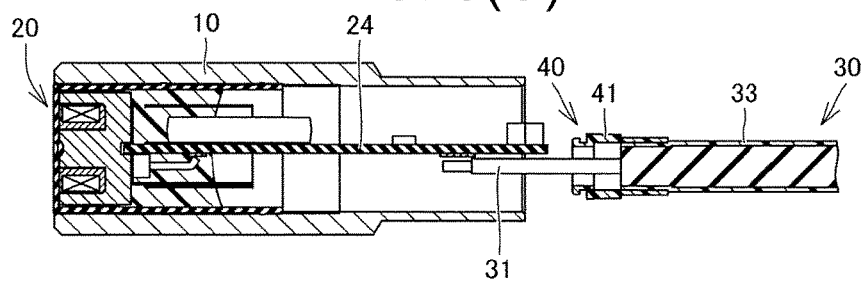

Next, the detector assembly 20 is assembled into the case 10 as shown in FIG. 5 and FIG. 6(D) (Step ST15). More specifically, the detector assembly 20 is assembled into the case 10 by press-fitting the detector assembly 20 into the front end of the case 10.

Figure 6E:
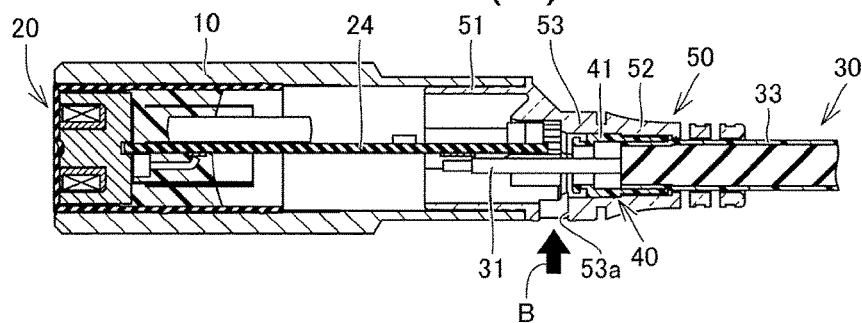

Next, the clamp 50 is assembled into the case 10 and the bonding intermediating member 40 as shown in FIG. 5 and FIG. 6(E) (Step ST16). More specifically, the fixing part 51 of the clamp 50 is press-fitted into the opening at the rear end of the case 10, the base 41 of the bonding intermediating member 40 is press-fitted into the rear end of the clamp 50, and thereby the clamp 50 is assembled into the case 10 and the bonding intermediating member 40.

Next, a liquid resin is injected into the case 10 and the clamp 50 and is cured as shown in FIG. 5 (Step ST17). More specifically, a liquid resin is injected from the part indicated by arrow B in FIG. 6(E) through the gate 53a of the clamp 50, then the liquid resin is cured, and thereby the proximity sensor 1A having the above-described configuration is obtained.

Note that, although the case in which the bonding intermediating member 40 is welded onto the cable 30 after the bonding intermediating member 40 is joined to the cable 30 and before the cable 30 is connected to the detector assembly 20 has been exemplified above, the bonding intermediating member 40 may be welded onto the cable 30 after the cable 30 is connected to the detector assembly 20 or after the detector assembly 20 is assembled into the case 10. That is to say, Step ST13 may be performed between Step ST14 and Step ST15 or between Step ST15 and Step ST16.

Furthermore, although the case in which the detector assembly 20 is assembled into the case 10 after the cable 30 is connected to the detector assembly 20 and before the clamp 50 is assembled into the case 10 and the bonding intermediating member 40 has been exemplified above, the detector assembly 20 may be assembled into the case 10 before the cable 30 is connected to the detector assembly 20. That is to say, Step ST15 may be performed prior to Step ST14.

Figure 8:
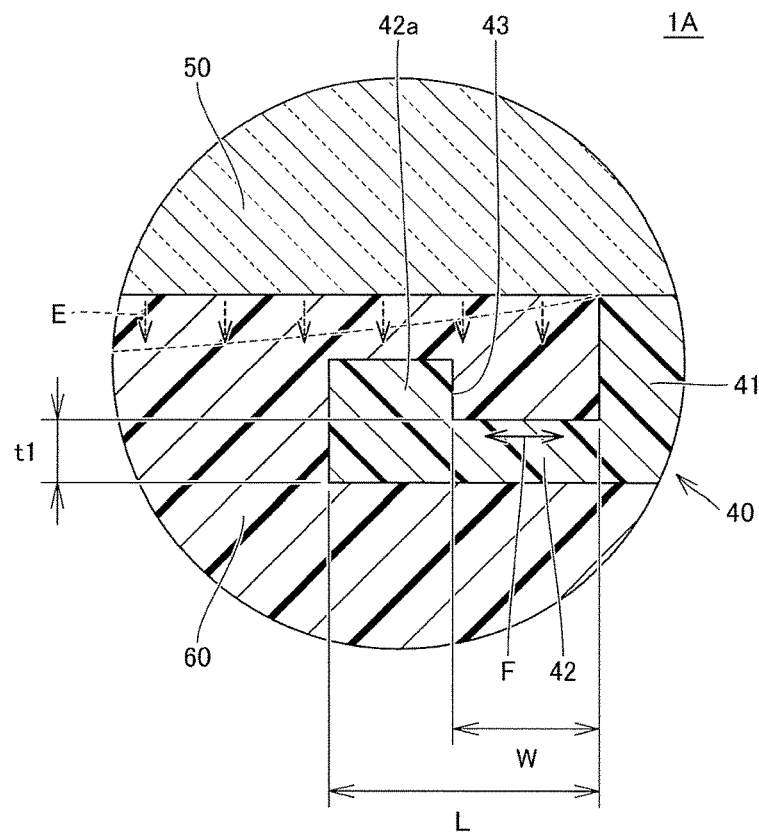
FIG. 8 is an enlarged cross-sectional view of area VIII shown in FIG. 7.

FIG. 7(A) and FIG. 7(B) each are schematic cross-sectional view for describing the reason for there being a strong bonding force that can be secured at the connection section of the cable with respect to the case and a front view of the cable to which the bonding intermediating member is fixed in the proximity sensor according to the present embodiment. In addition, FIG. 8 is an enlarged cross-sectional view of area VIII shown in FIG. 7(A). Next, the reason for the strong bonding force secured in the proximity sensor 1A according to the present embodiment will be described with reference to FIGS. 7 and 8. Note that the clamp 50 is depicted to have a simplified configuration in FIG. 7(A) in order to facilitate understanding.

In the proximity sensor 1A according to the present embodiment, the substantially cylindrical protrusion 42 that is configured to have a sufficiently thin thickness and positioned protruding from the end of the sheath 33 is provided in the bonding intermediating member 40 that is provided to cover the end of the sheath 33 of the cable 30, and the inner circumferential face and the outer circumferential face of the protrusion 42 and the end face at the tip side of the protrusion 42 in the axial direction are all covered by the second sealing resin part 60 as described above with reference to FIG. 7(A) and FIG. 7(B).

With the above-described configuration, firstly, residual stress created during the curing of the second sealing resin part 60 can be reduced. This is because an amount of resin of the second sealing resin part 60 placed in the end of the second sealing resin part 60 on the bonding intermediating member 40 side decreases to the extent of the protrusion 42 placed therein in contrast to Comparative examples 1 and 2 that will be described below.

Thus, a strong bonding force can be maintained inversely proportional to the reduction of the residual stress, and as a result, the strong bonding force can be secured at the connection section of the cable 30 with respect to the case 10.

In addition, secondly, when the second sealing resin part 60 expands and contracts in accordance with changes of environment temperature, a tracking property of the protrusion 42 can be obtained. This is because the protrusion 42 is allowed to be elastically deformed tracking the expansion and contraction of the second sealing resin part 60 due to the thin thickness of the protrusion 42 that is the bonding section of the bonding intermediating member 40 and the second sealing resin part 60 in contrast to Comparative examples 1 and 2 that will be described below.

More specifically, when the second sealing resin part 60 contracts, great local stress is exerted on ends of the interface between the bonding intermediating member 40 and the second sealing resin part 60 as indicated by arrows C in FIG. 7(A). At this time, however, the protrusion 42 tracks the contraction and is elastically deformed in the directions of arrows D shown in the drawing, which dramatically alleviates the stress exerted on the ends, and thus separation occurring on the interface can be suppressed.

Thus, the strong bonding force can be maintained according to an amount by which the stress exerted on the interface between the bonding intermediating member 40 and the second sealing resin part 60 is reduced when the second sealing resin part 60 expands and contracts, and as a result, a strong bonding force at the connection section of the cable 30 with respect to the case 10 can be secured.

Adoption of the above-described structure allows materials of the bonding intermediating member 40 and the second sealing resin part 60 to be selected in a wide range, and thus an effect that various restrictions on manufacturing are reduced can also be exhibited for the proximity sensor 1A according to the present embodiment.

In addition, the groove 43 extending on the outer circumferential face of the protrusion 42 in the circumferential direction as described above is provided in the proximity sensor 1A according to the present embodiment as shown in FIG. 7(A) and FIG. 8. This configuration helps the above-described so-called anchoring effect be obtained.

More specifically, when the second sealing resin part 60 contracts in accordance with a change of an environment temperature as shown in FIG. 8, the contraction occurs around an outer circumferential face of the second sealing resin part 60 that is the contact face with respect to the clamp 50 in the direction indicated by arrows E of the drawing and accordingly shear stress occurs on the interface between the bonding intermediating member 40 and the second sealing resin part 60 in the direction indicated by arrow F of the drawing as shown in FIG. 8. However, the shear stress can be stopped from reaching a tip 42a of the protrusion 42 since the groove 43 is positioned on the outer circumferential face of the protrusion 42, and as a result, occurrence of separation of the components on the interface can be suppressed.

As described above, the strong bonding force can be secured at the connection section of the cable 30 with respect to the case 10 by adopting the proximity sensor 1A according to the present embodiment, it is possible to effectively stop damage such as separation from occurring in the section, and as a result, a proximity sensor having excellent environmental resistance can be obtained.

Note that a thickness t1 of a thinnest portion of the protrusion 42 is preferably set to a value in the range of 0.3 mm to 0.5 mm with reference to FIG. 8. More specifically, the thickness t1 preferably includes a portion having a thickness in the range of 0.3 mm to 0.5 mm in the circumferential direction of the protrusion 42. Elasticity and stiffness of the protrusion 42 are appropriately adjusted due to the above-described configuration, and thus the above-described tracking property can be obtained more reliably. However, a thickness of the protrusion 42 is not particularly limited thereto.

In addition, a length L of the protrusion 42 in the axial direction is preferably set to a value greater than or equal to 0.5 mm. Elasticity and stiffness of the protrusion 42 are appropriately adjusted by setting the length L thereof in the axial direction to a value greater than or equal to 0.5 mm, and thus the above-described tracking property can be obtained more reliably. However, a length of the protrusion 42 in the axial direction is not particularly limited thereto.

Furthermore, a width W of the groove 43 is preferably set to a value greater than or equal to 0.5 mm. Elasticity and stiffness of the protrusion 42 are appropriately adjusted by setting the width W to a value greater than or equal to 0.5 mm, and thus the above-described tracking property can be obtained more reliably. However, a width of the groove 43 is not particularly limited thereto.

In addition, although the case in which the groove 43 extending on the outer circumferential face of the protrusion 42 in the circumferential direction in the proximity sensor 1A according to the present embodiment has been exemplified as described above, an uneven part having a different shape from the groove may be provided on one of the outer circumferential face and the inner circumferential face of the protrusion 42 or both, and a hole that penetrates the protrusion 42 in a radial direction, or any of various types of notches may be provided in the protrusion 42. The above-described anchoring effect can be obtained as well in the above-described configuration.

Moreover, although the case in which the protrusion 42 has a substantially cylindrical shape in the proximity sensor 1A according to the present embodiment as described above has been exemplified, an outer shape of the protrusion 42 may be any shape, for example, a polygonal cylinder shape or an oval cylinder shape as long as it is cylindrical.

In addition, for the proximity sensor 1A according to the present embodiment, a material of the second sealing resin part 60 is preferably selected from an epoxy resin and a PUR resin, a material of the bonding intermediating member 40 is preferably selected from a PBT resin, a PUR resin, a nylon-based resin, and a fluorine-based resin, and a material of the sheath 33 is preferably selected from a PVC resin, a PUR resin, and a fluorine-based resin as described above.

Furthermore, when a fluorine-based resin is selected for a material of the bonding intermediating member 40 and a fluorine-based resin is likewise selected for a material of the sheath 33, very high oil resistance can be obtained. Thus, it is preferable to use a combination of these materials for a proximity sensor used in an environment in which a large amount of oil such as cutting oil is used.

Here, welding can be easily performed when a difference between melting points of members to be bonded to each other is normally in a range equal to or lower than approximately 50°. Thus, it is necessary to select materials considering this point when the materials are to be selected.

Note that a thickness t2 of the welded part 41a of the bonding intermediating member 40 that is formed by welding the bonding intermediating member 40 onto the sheath 33 shown in FIG. 7 needs to be set considering a sealing property of the welded part. Thus, a thickness of the portion of the base 41 that will be the welded part 41a before the welding is preferably set to a value in a range of approximately 0.3 mm to 0.5 mm.

In addition, although the case in which the base 41 of the bonding intermediating member 40 is fixed to the end of the sheath 33 positioned at the one end side of the cable 30 as described above has been exemplified in the present embodiment, it is not necessary to adopt this configuration, and the base may be fixed to the sheath 33 at a position away from the end of the sheath 33. That is to say, the bonding intermediating member may have the cylindrical base covering the outer circumferential face of the sheath and the cylindrical protrusion protruding toward the one end side of the cable, and a positional relationship between the end of the sheath and the base and a positional relation between the end of the sheath and the protrusion can be variously modified.

Comparative Example 1

Figure 9:
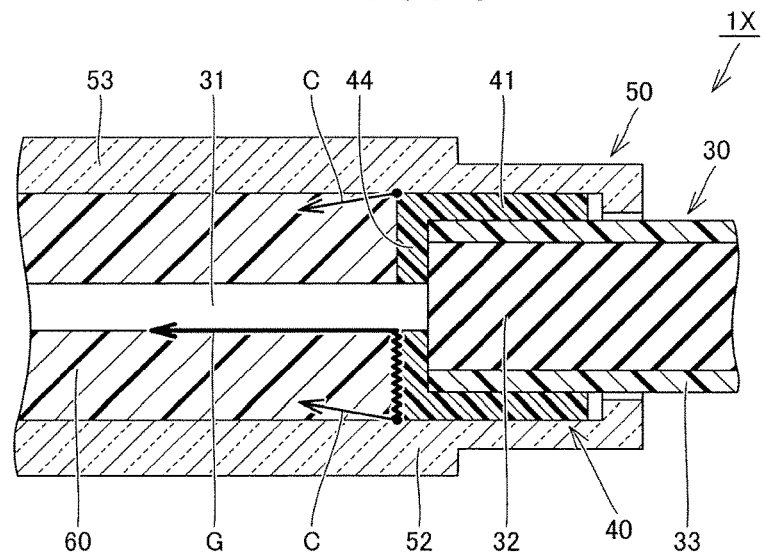
FIG. 9 is a schematic cross-sectional view of a connection section of a cable and a case of a proximity sensor according to Comparative example 1.

FIG. 9 is a schematic cross-sectional view of a connection section of a cable and a case of a proximity sensor according to Comparative example 1. The proximity sensor 1X according to Comparative example 1 will be described below with reference to FIG. 9 to be compared to the proximity sensor 1A according to the above-described embodiment.

In the proximity sensor 1X according to Comparative example 1, the bonding intermediating member 40 does not have the protrusion 42, and a lid 44 is instead provided to cover end faces of the sheath 33 and the shielding material 32 as shown in FIG. 9, unlike in the proximity sensor 1A according to the above-described Embodiment 1.

In the proximity sensor 1X configured as described above, since an amount of resin of the second sealing resin part 60 at the end of the second sealing resin part 60 on the bonding intermediating member 40 side is large, residual stress created during curing of the second sealing resin part 60 may not be sufficiently reduced.

In addition, great local stress is also exerted on ends of an interface between the bonding intermediating member 40 and the second sealing resin part 60 as indicated by arrow C of the diagram in the proximity sensor 1X configured as described above when the second sealing resin part 60 expands and contracts in accordance with changes of environment temperature, however, the bonding intermediating member 40 is not elastically deformed in the configuration, and thus the stress exerted on the ends is not alleviated.

For that reason, when separation occurs at the ends, a liquid infiltration path is generated as indicated by arrow G of the drawing, and accordingly a liquid such as water or oil reaches the circuit board, electronic components, and a bonding section thereof via the liquid infiltration path, which eventually leads to a problem in the proximity sensor 1X.

Therefore, in the proximity sensor 1X according to Comparative example 1, a bonding force at the connection section of the cable 30 with respect to the case 10 deteriorates more than in the above-described Embodiment 1, thus it is hard to effectively stop damage such as separation of the section from occurring, and as a result, sufficient environmental resistance is not obtained when the proximity sensor is used in a relatively severe environment.

Comparative Example 2

Figure 10:
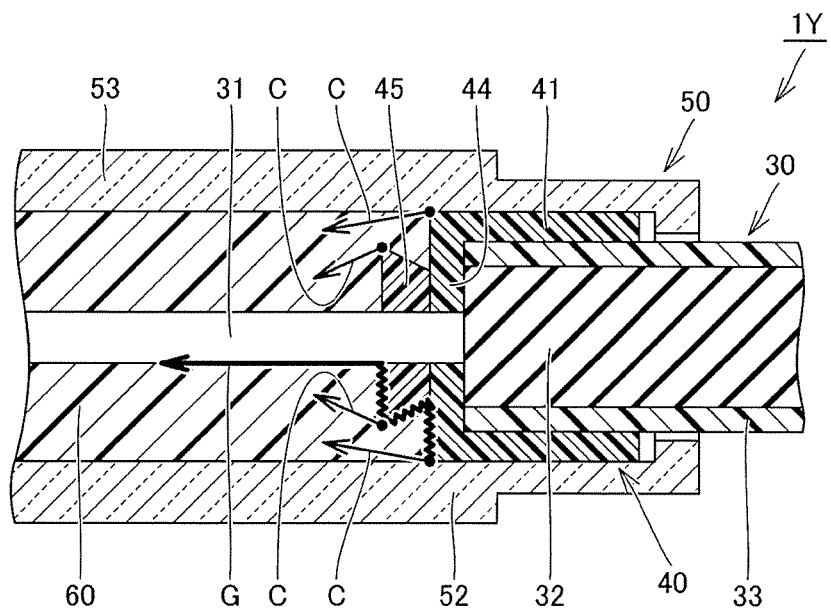
FIG. 10 is a schematic cross-sectional view of a connection section of a cable and a case of a proximity sensor according to Comparative example 2.

FIG. 10 is a schematic cross-sectional view of a connection section of a cable and a case of a proximity sensor according to Comparative example 2. The proximity sensor 1Y according to Comparative example 2 will be described below with reference to FIG. 10 to be compared to the proximity sensor 1A according to the above-described embodiment.

In the proximity sensor 1Y according to Comparative example 2, the bonding intermediating member 40 does not have the protrusion 42, a lid 44 covering end faces of the sheath 33 and the shielding material 32 is provided instead, and a protrusion 45 having an inverted truncated cone shape is formed to protrude from the lid 44 as shown in FIG. 10, unlike in the proximity sensor 1A according to above-described Embodiment 1.

In the proximity sensor 1Y configured as described above, great local stress is exerted on ends of an interface between the bonding intermediating member 40 and the second sealing resin part 60 as indicated by arrow C of the drawing when the second sealing resin part 60 expands and contracts in accordance with changes of environment temperature, however, the bonding intermediating member 40 is not elastically deformed in the configuration, and thus the stress exerted on the ends is not alleviated.

Thus, when separation occurs at the ends, a liquid infiltration path indicated by arrow G of the drawing is generated, thus accordingly a liquid such as water or oil reaches the circuit board, electronic components, and a bonding section thereof via the liquid infiltration path, which eventually leads to a problem in the proximity sensor 1Y.

Here, in the proximity sensor 1Y according to Comparative example 2, an effect that stress created during curing of the second sealing resin part 60 is distributed as far as a bonding area of the bonding intermediating member 40 and the second sealing resin part 60 is obtained and the liquid infiltration path also becomes as long as the protrusion 45 having the inverted truncated cone shape, unlike in the proximity sensor 1X according to above-described Comparative example 1. Thus, although an environment-resisting function for the proximity sensor 1Y according to Comparative example 2 superior to that of the proximity sensor 1X according to Comparative example 1 is obtained, basic breakage modes are the same, which makes it hard to say that a fundamental solution is gained.

Therefore, in the proximity sensor 1Y according to Comparative example 2, a bonding force at the connection section of the cable 30 with respect to the case 10 deteriorates more than in above-described Embodiment 1, thus it is hard to satisfactorily stop damage such as separation of the section from occurring, and as a result, sufficient environmental resistance is not obtained when the proximity sensor is used in a relatively severe environment.

(Modification 1)

Figure 11:
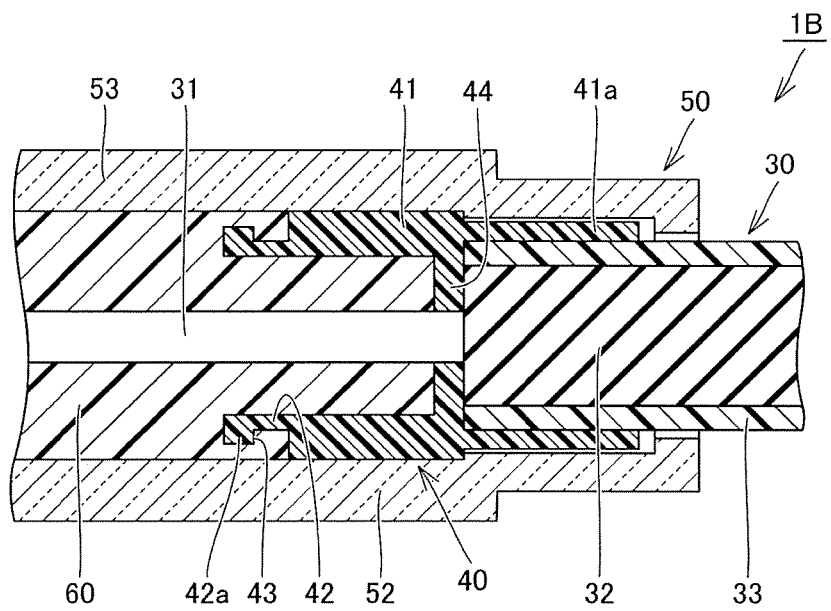
FIG. 11 is an enlarged cross-sectional view of a main section of a proximity sensor according to Modification 1.

FIG. 11 is an enlarged cross-sectional view of a main section of a proximity sensor according to Modification 1 on the basis of above-described Embodiment 1. The proximity sensor 1B according to Modification 1 will be described below with reference to FIG. 11.

The proximity sensor 1B according to Modification 1 is different from the proximity sensor 1A according to above-described Embodiment 1 in that the bonding intermediating member 40 has the lid 44 covering end faces of the sheath 33 and the shielding material 32 in addition to the base 41 and the protrusion 42 as shown in FIG. 11.

A reduction of residual stress created during curing of the second sealing resin part 60 and a tracking property of the protrusion 42 when the second sealing resin part 60 expands and contracts in accordance with changes of environment temperature in described Embodiment 1 are also obtained in this configuration, and thus a strong bonding force at the connection section of the cable 30 with respect to the case 10 can be secured. Therefore, the proximity sensor 1B according to Modification 1 can also exhibit excellent environmental resistance.

(Modification 2)

Figure 12:
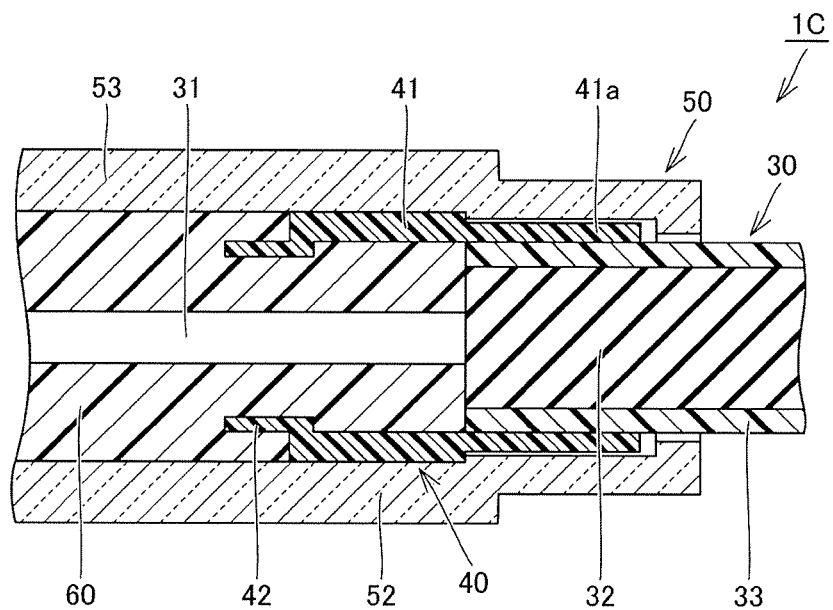
FIG. 12 is an enlarged cross-sectional view of a main section of a proximity sensor according to Modification 2.

FIG. 12 is an enlarged cross-sectional view of a main section of a proximity sensor according to Modification 2 on the basis of above-described Embodiment 1. The proximity sensor 1C according to Modification 2 will be described below with reference to FIG. 12.

The proximity sensor 1C according to Modification 2 is different from the proximity sensor 1A according to above-described Embodiment 1 in view of a point that the groove 43 is not provided in the protrusion 42 of the bonding intermediating member 40 as shown in FIG. 12.

A reduction of residual stress created during curing of the second sealing resin part 60 and a tracking property of the protrusion 42 when the second sealing resin part 60 expands and contracts in accordance with changes of environment temperature described in Embodiment 1 are also obtained in this configuration, and thus a strong bonding force at the connection section of the cable 30 with respect to the case 10 can be secured. Therefore, the proximity sensor 1C according to Modification 2 can also exhibit excellent environmental resistance.

(Modification 3)

Figure 13:
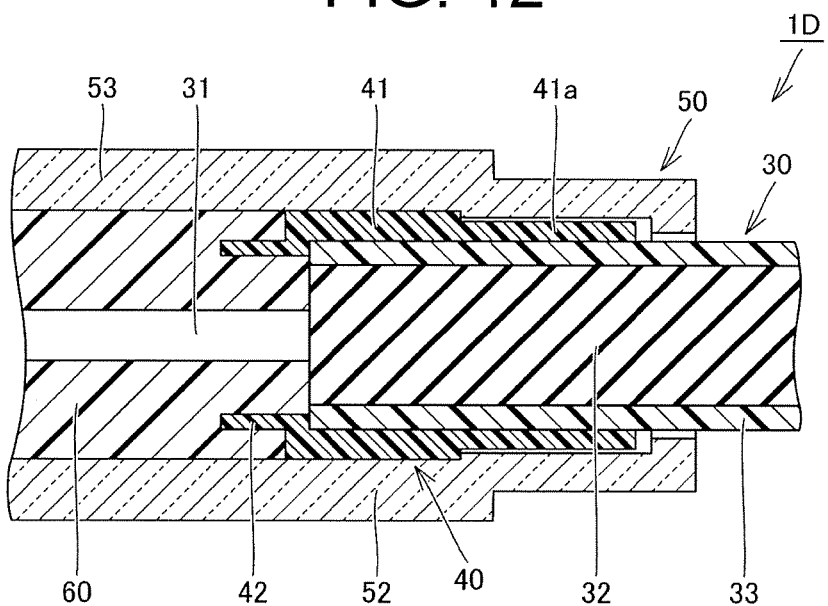
FIG. 13 is an enlarged cross-sectional view of a main section of a proximity sensor according to Modification 3.

FIG. 13 is an enlarged cross-sectional view of a main section of a proximity sensor according to Modification 3 on the basis of above-described Embodiment 1. The proximity sensor 1D according to Modification 3 will be described below with reference to FIG. 13.

The proximity sensor 1D according to Modification 3 is different from the proximity sensor 1C according to above-described Modification 2 only in that the base 41 of the bonding intermediating member 40 almost does not include a portion protruding from an end of the sheath 33 of the cable 30 and the protrusion 42 is provided to connect and extend from a portion of the base 41 at a position on an end face of the sheath 33 as shown in FIG. 13.

A reduction of residual stress created during curing of the second sealing resin part 60 and a tracking property of the protrusion 42 when the second sealing resin part 60 expands and contracts in accordance with changes of environment temperature described in Embodiment 1 above are also obtained in this configuration as in above-described Modification 3, and thus a strong bonding force at the connection section of the cable 30 with respect to the case 10 can be secured. Therefore, the proximity sensor 1D according to Modification 3 can also exhibit excellent environmental resistance.

(Modification 4)

Figure 14:
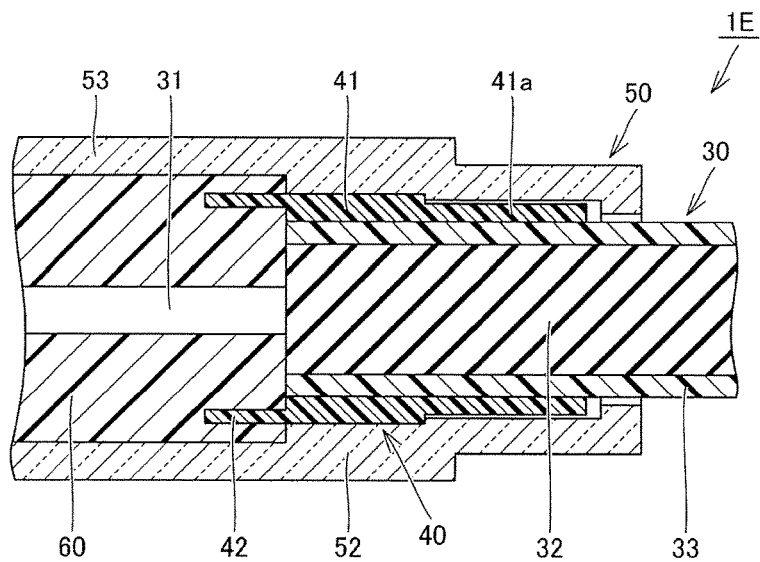
FIG. 14 is an enlarged cross-sectional view of a main section of a proximity sensor according to Modification 4.

FIG. 14 is an enlarged cross-sectional view of a main section of a proximity sensor according to Modification 4 on the basis of above-described Embodiment 1. The proximity sensor 1E according to Modification 4 will be described below with reference to FIG. 14.

The proximity sensor 1E according to Modification 4 is different from the proximity sensor 1D according to above-described Modification 3 in that the base 41 of the bonding intermediating member 40 and the protrusion 42 have substantially the same-sized outer shape and accordingly an inner diameter of the portion of the clamp 50 corresponding to the protrusion 42 is configured to be greater than an inner diameter of the portion of the clamp 50 corresponding to the base 41 as shown in FIG. 14.

A reduction of residual stress created during curing of the second sealing resin part 60 and a tracking property of the protrusion 42 when the second sealing resin part 60 expands and contracts in accordance with changes of environment temperature described in Embodiment 1 above are also obtained in this configuration as in above-described Modification 3, and thus a strong bonding force at the connection section of the cable 30 with respect to the case 10 can be secured. Therefore, the proximity sensor 1E according to Modification 4 can also exhibit excellent environmental resistance.

Embodiment 2

Figure 15:
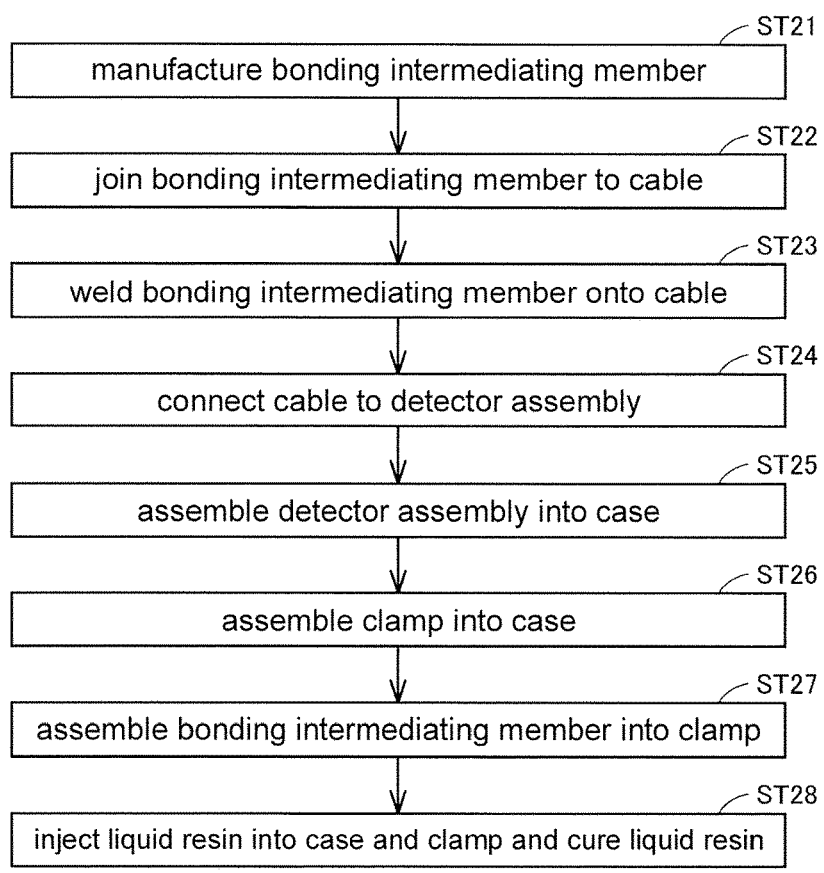
FIG. 15 is a flowchart for describing a manufacturing method of a proximity sensor according to Embodiment 2 of the present invention.

FIGS. 15 and 16 each are a flowchart and an assembly diagram for describing a manufacturing method of a proximity sensor according to Embodiment 2 of the present invention. The manufacturing method of the proximity sensor according to the present embodiment will be described below with reference to FIGS. 15 and 16.

Note that, since the manufacturing method of the proximity sensor according to the present embodiment is slightly different from the manufacturing method of the proximity sensor 1A according to above-described Embodiment 1 as will be described below, a shape thereof is accordingly slightly different as well. However, since a specific form of the proximity sensor is roughly clarified in the assembly diagram of FIG. 16, illustration of the assembly is omitted here.

First, the bonding intermediating member 40 is manufactured (Step ST21), then the bonding intermediating member 40 is joined to the cable 30 (Step ST22), then the bonding intermediating member 40 is welded onto the cable 30 (Step ST23), then the cable 30 is connected to the detector assembly 20 (Step ST24), and then the detector assembly 20 is assembled into the case 10 (Step ST25) as indicated in FIG. 15. Note that, since details of Steps ST21 to ST25 are similar to Steps ST11 to ST15 described in FIG. 5 above, description thereof is not repeated here.

Figure 16A:
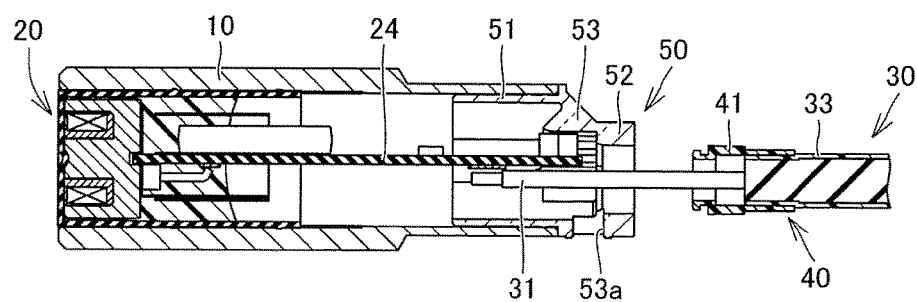
FIG. 16(A) to FIG. 16(B) are an assembly diagram for describing the manufacturing method of the proximity sensor according to Embodiment 2 of the present invention.

Next, the clamp 50 is assembled into the case 10 as shown in FIG. 15 and FIG. 16(A) (Step ST26). More specifically, the fixing part 51 of the clamp 50 is press-fitted into the opening at the rear end side of the case 10.

Figure 16B:
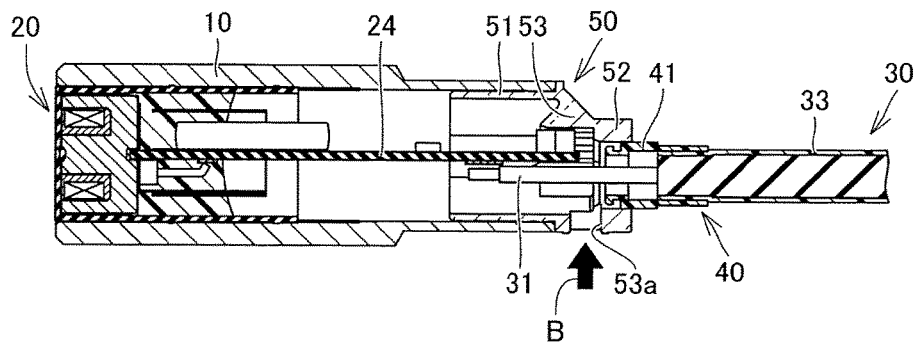

Next, the bonding intermediating member 40 is assembled into the clamp 50 as shown in FIG. 15 and FIG. 16(B) (Step ST27). More specifically, the base 41 of the bonding intermediating member 40 is press-fitted into the rear end of the clamp 50 and thereby the clamp 50 is assembled together with the bonding intermediating member 40.

Next, a liquid resin is injected into the case 10 and the clamp 50 and cured as indicated in FIG. 15 (Step ST28). Note that, since details of Step ST28 are similar to those of Step ST17 indicated in the above-described FIG. 5, description thereof is not repeated here. Accordingly, the proximity sensor according to the present embodiment equivalent to the proximity sensor 1A according to above-described Embodiment 1 is obtained.

Note that, although the case in which the bonding intermediating member 40 is welded onto the cable 30 after the bonding intermediating member 40 is joined to the cable 30 and before the cable 30 is connected to the detector assembly 20 has been exemplified in the above description, the bonding intermediating member 40 may be welded onto the cable 30 at a timing after the cable 30 is connected to the detector assembly 20 before a proximity sensor is completed. That is to say, Step ST23 may be performed after any step from Steps ST24 to ST28 as long as it is performed after Step ST24.

Furthermore, although the case in which the detector assembly 20 is assembled into the case 10 after the cable 30 is connected to the detector assembly 20 and before the clamp 50 is assembled into the case 10 has been exemplified above, the detector assembly 20 may be assembled into the case 10 before the detector assembly 20 is connected to the cable 30. That is to say, Step ST25 may be performed before Step ST24.

A reduction of residual stress created during curing of the second sealing resin part 60 and a tracking property of the protrusion 42 when the second sealing resin part 60 expands and contracts in accordance with changes of environment temperature described in Embodiment 1 above are also obtained in this configuration of the above-described proximity sensor according to the present embodiment, and thus a strong bonding force at the connection section of the cable 30 with respect to the case 10 can be secured. Therefore, the proximity sensor according to the present embodiment can also exhibit excellent environmental resistance.

Although the cases in which the bonding intermediating member is fixed to the cable using welding have been exemplified in above-described Embodiment 1 and 2 of the present invention and modifications thereof, the invention may not necessarily be configured as above. For example, the bonding intermediating member may be provided by insert-molding a liquid resin at the end of the sheath of the cable.

In addition, although the case in which the composite cable with the shielding material is used for a cable drawn out from the case has been exemplified in above-described Embodiment 1 and 2 of the present invention and modifications thereof any of various cables may be used as the cable, and the present invention can also be applied to, for example, a composite cable not including the above-described shielding material or a cable only constituted by a conductive wire and a sheath covering the wire (a so-called lead wire, or the like).

Furthermore, although the case in which the internal space defined by the case and the clamp is filled with the first sealing resin part and the second sealing resin part has been exemplified in above-described Embodiment 1 and 2 of the present invention and modifications thereof, the invention may not necessarily be configured as above, and the space may be filled with only a single sealing resin part.

In addition, although the case in which the bonding intermediating member is constituted by a single component has been exemplified in above-described Embodiment 1 and 2 of the present invention and modifications thereof, the bonding intermediating member may be constituted by a plurality of components or by a two-color molding member.

Furthermore, although the case in which the present invention is applied to a proximity sensor has been exemplified in above-described Embodiment 1 and 2 of the present invention and modifications thereof, the invention can of course be applied to sensors other than proximity sensors and various electronic apparatuses other than sensors.

The embodiments and modifications thereof disclosed as above are merely examples in all aspects and are not limitative. The technical scope of the present invention is demarcated by the claims and includes all modifications having the gist equivalent to that of the claims within the scope thereof.

What is claimed is:

1. An electronic apparatus comprising:
   a case having an opening;
   an electronic component housed in the case;
   a cable whose one end is inserted into the opening to be electronically connected to the electronic component and the other end is drawn out to outside;
   a bonding intermediating member that is made of a resin and joined to the cable;
   a cylindrical clamp that fits into the opening and holds the cable when the bonding intermediating member fits into the cylindrical clamp; and
   a sealing resin part that fills an internal space defined by the case and the cylindrical clamp,
   wherein the cable has a core wire comprising a conductive wire and a sheath that is made of a resin covering the core wire,
   the core wire is exposed at the one end side of the cable without being covered by the sheath,
   the bonding intermediating member has a cylindrical base covering an outer circumferential face of the sheath and a cylindrical protrusion protruding toward the one end side of the cable,
   the bonding intermediating member is entirely covered by the cylindrical clamp, and
   an inner circumferential face and an outer circumferential face of the cylindrical protrusion and an end face at a tip side of the cylindrical protrusion in an axial direction are all covered by the sealing resin part.

2. The electronic apparatus according to claim 1, wherein an outer shape of the cylindrical protrusion is smaller than an outer shape of the cylindrical base when the cylindrical protrusion is viewed in an extending direction of the cable.

3. The electronic apparatus according to claim 1, wherein the bonding intermediating member is fixed to the cable by welding the cylindrical base onto the sheath.

4. The electronic apparatus according to claim 3,
   wherein the cylindrical base comprises a welded part that is welded onto the sheath and a non-welded part that is not welded onto the sheath, and
   a thickness of the cylindrical protrusion is thinner than a thickness of the non-welded part.

5. The electronic apparatus according to claim 1, wherein the bonding intermediating member is fixed to the cable by forming the bonding intermediating member through insert-molding to cover the sheath.

6. The electronic apparatus according to claim 1, wherein the cylindrical protrusion comprises a portion having a thickness in a range of 0.3 mm to 0.5 mm in a circumferential direction of the cylindrical protrusion.

7. The electronic apparatus according to claim 1, wherein a length of the cylindrical protrusion in an axial direction is greater than or equal to 0.5 mm.

8. The electronic apparatus according to claim 1, wherein a groove extending in a circumferential direction is provided on the outer circumferential face of the cylindrical protrusion.

9. The electronic apparatus according to claim 1,
   wherein the sealing resin part is formed of one of an epoxy resin and a polyurethane resin,
   the bonding intermediating member is formed of one of a polybutylene terephthalate resin, a polyurethane resin, a nylon-based resin, and a fluorine-based resin, and
   the sheath is formed of one of a polyvinyl chloride resin, a polyurethane resin, and a fluorine-based resin.

* * * * *